US008580680B2

(12) United States Patent
Luoh et al.

(10) Patent No.: US 8,580,680 B2
(45) Date of Patent: Nov. 12, 2013

(54) METAL SILICIDE FORMATION

(75) Inventors: Tuung Luoh, Taipei (TW); Sheng Hui Hsieh, Taipei (TW); Ricky Huang, Taipei (TW); Chin-Ta Su, Yunlin Country (TW); Tahone Yang, Miaoli County (TW); Kuang-Chao Chen, Taipei (TW)

(73) Assignee: Macronix International Co., Ltd. (TW)

( * ) Notice: Subject to any disclaimer, the term of this patent is extended or adjusted under 35 U.S.C. 154(b) by 314 days.

(21) Appl. No.: 12/915,917

(22) Filed: Oct. 29, 2010

(65) Prior Publication Data
US 2012/0104516 A1    May 3, 2012

(51) Int. Cl.
*H01L 21/44*    (2006.01)
(52) U.S. Cl.
USPC ............. 438/655; 257/E21.165; 257/E21.439
(58) Field of Classification Search
USPC ...................... 257/E2.165, E21.439; 438/655
See application file for complete search history.

(56) References Cited

U.S. PATENT DOCUMENTS

| 5,780,362 A * | 7/1998 | Wang et al. ................... 438/683 |
| 2004/0175909 A1* | 9/2004 | Matsumoto ................... 438/592 |
| 2008/0020535 A1* | 1/2008 | Gulari et al. .................. 438/299 |

\* cited by examiner

*Primary Examiner* — Howard Weiss
(74) *Attorney, Agent, or Firm* — Baker & McKenzie LLP

(57) ABSTRACT

Techniques for forming metal silicide contact pads on semiconductor devices are disclosed, and in one exemplary embodiment, a method may comprise depositing a metal layer on and between a plurality of raised silicon-based features formed on a semiconductor substrate, the metal layer comprising metal capable of reacting with external silicon-based portions of the features to form a metal silicide. In addition, such a method may also include depositing a cap layer on the metal layer deposited on and between the plurality of raised silicon-based features, wherein a thickness of the cap layer on the metal layer between the raised features is greater than or equal to a thickness of the cap layer on the metal layer on the raised features. Furthermore, such a method may also include annealing the structure to cause portions of the metal layer to react with portions of the external silicon-based portions of the features to form metal silicide pads on and between the raised features.

21 Claims, 4 Drawing Sheets

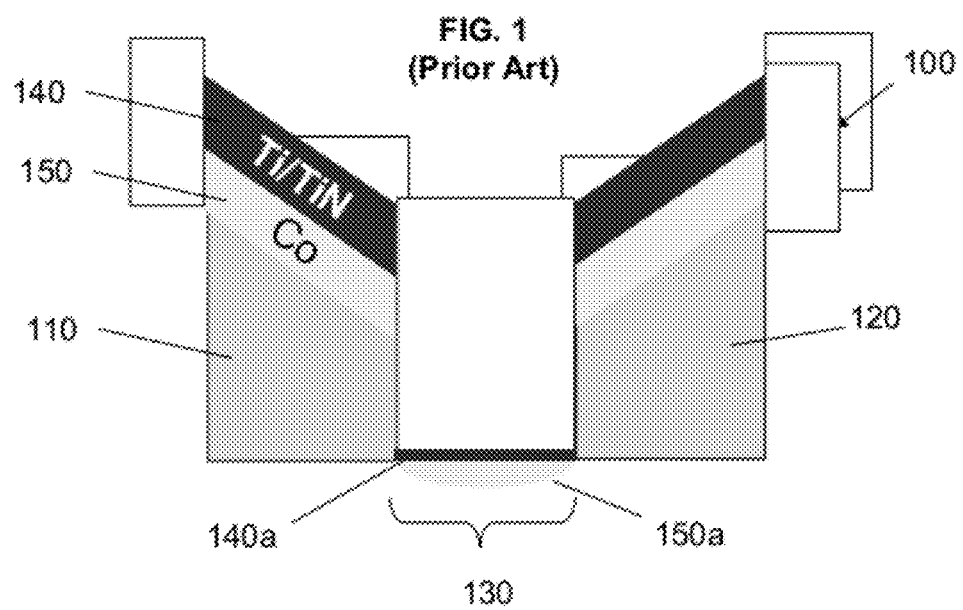
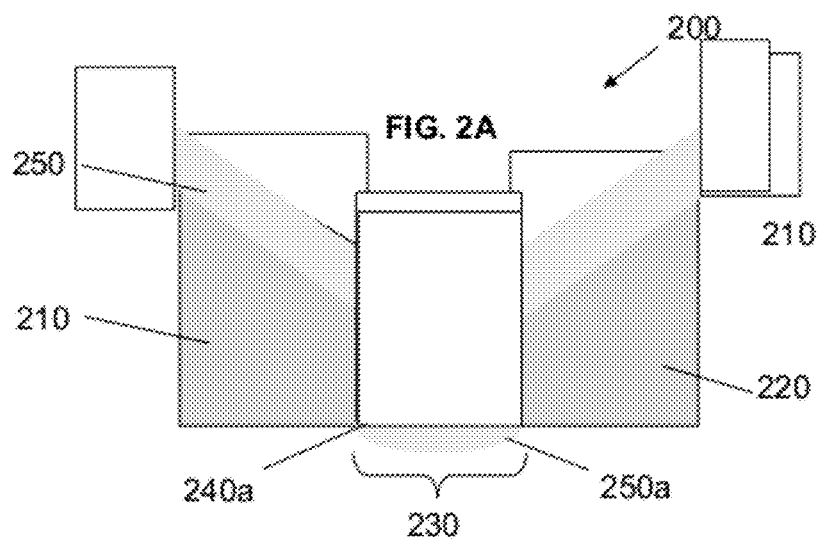

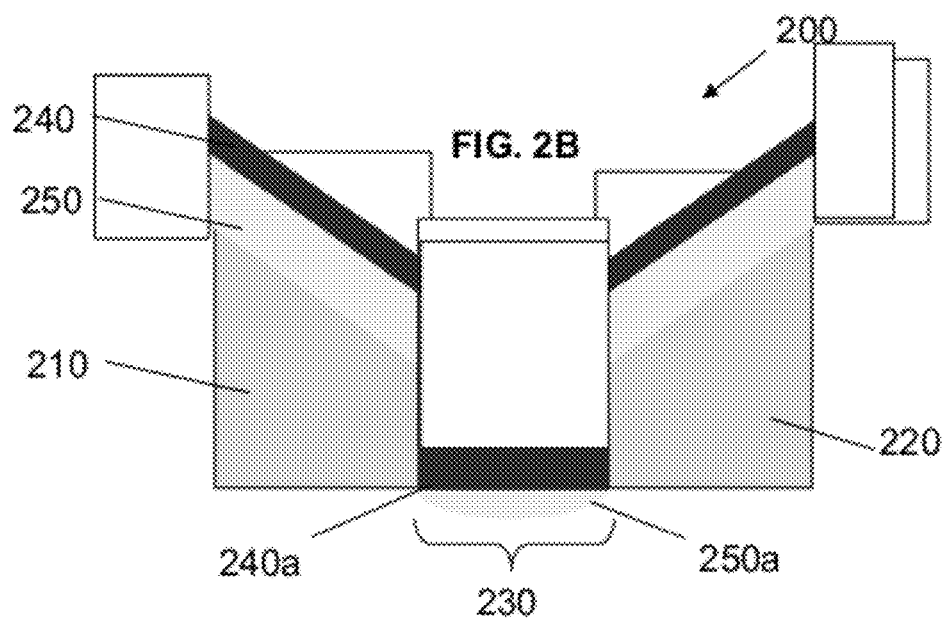
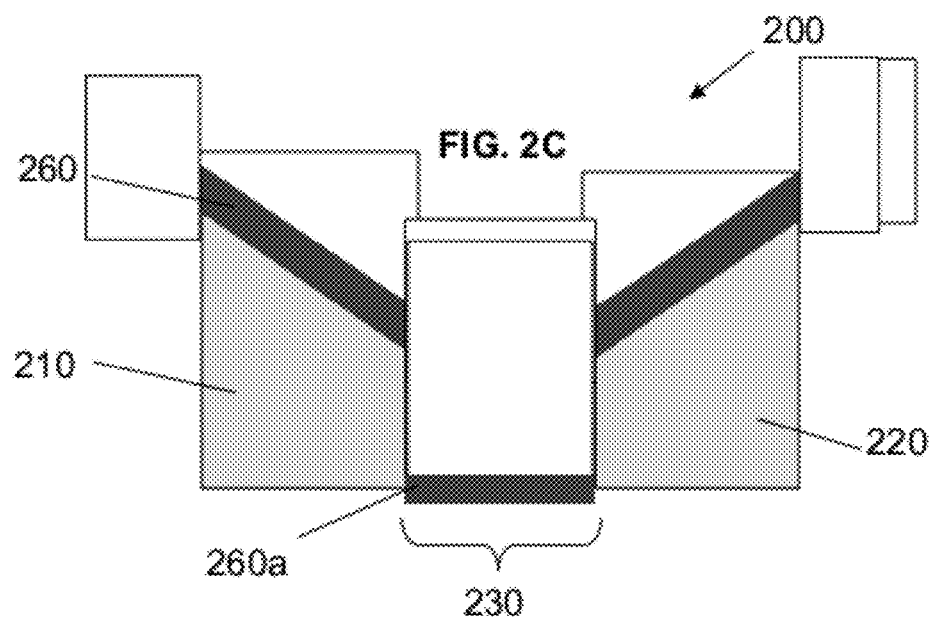

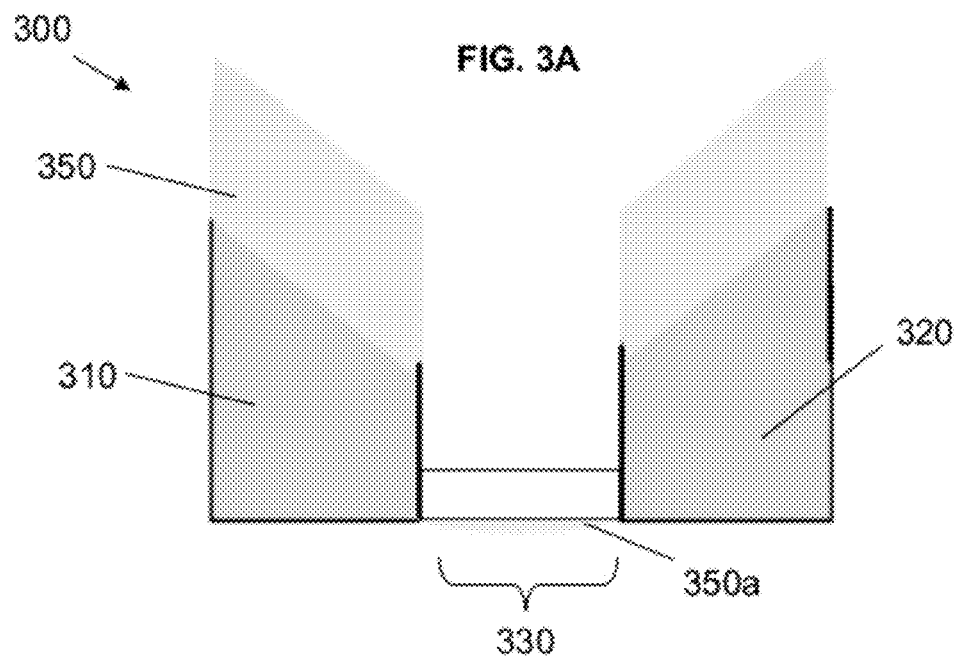
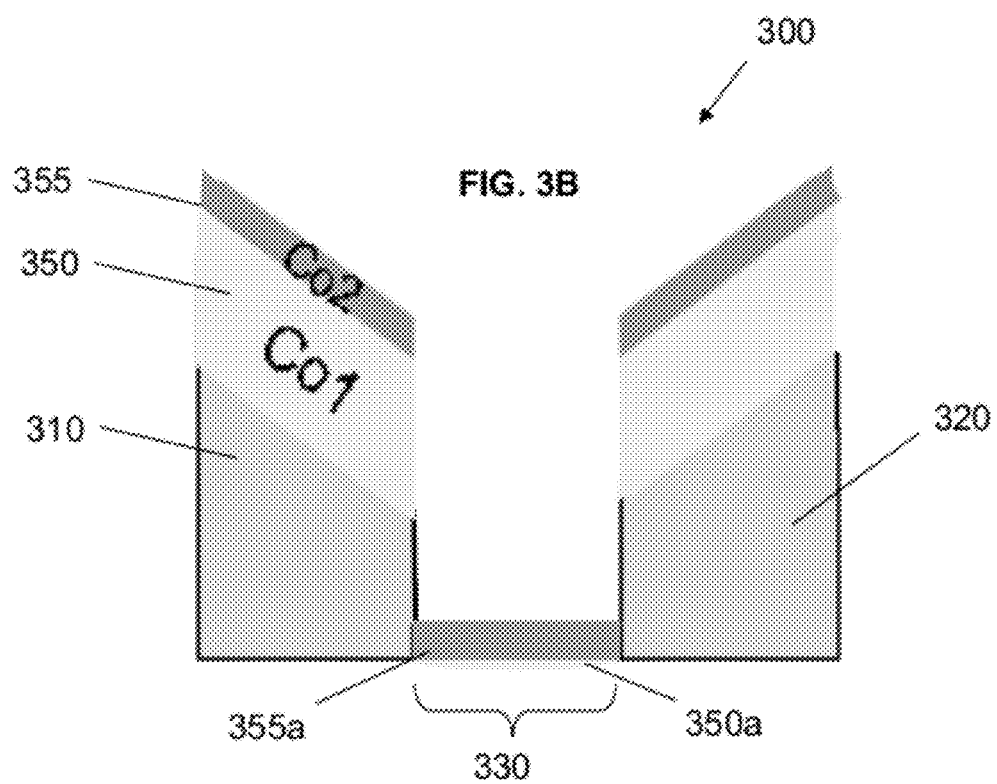

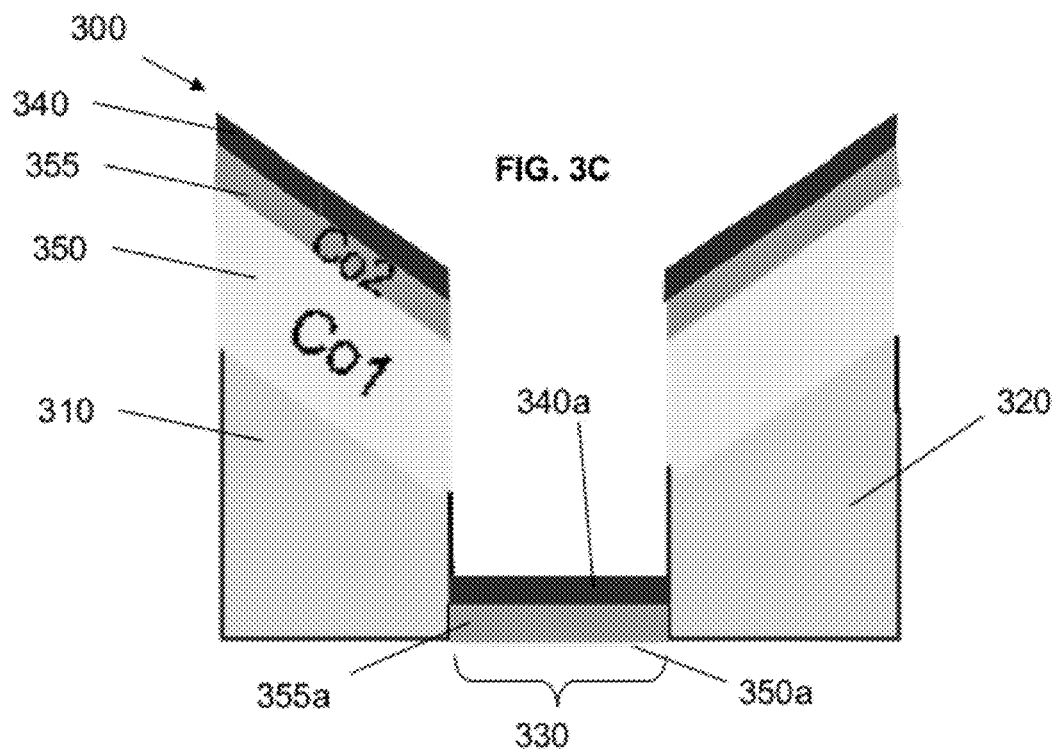
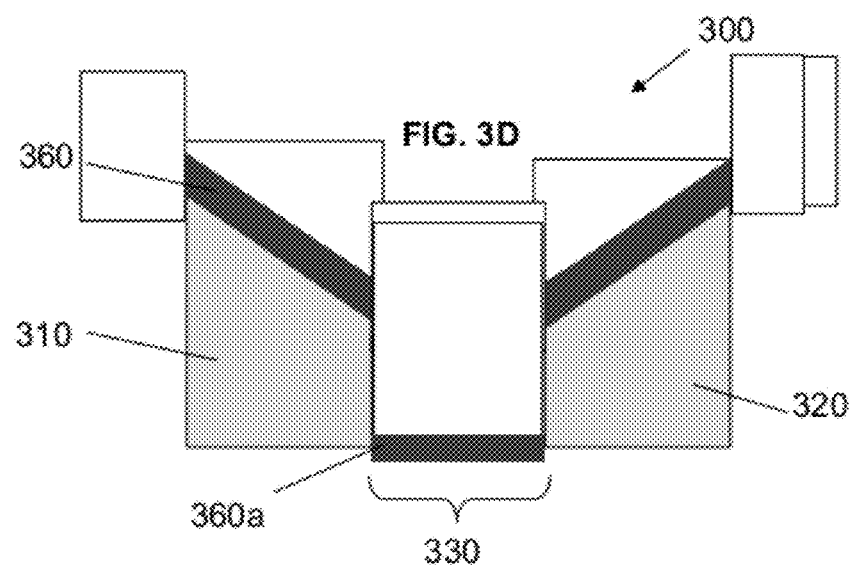

METAL SILICIDE FORMATION

BACKGROUND

1. Technical Field

The present disclosure relates in general to the manufacture of semiconductor devices, and more particularly to novel processes for forming metal silicide contact pads on semiconductor devices.

2. Related Art

As technology in products and equipment continues to become more complex, the use of integrated circuit (IC) devices in these products and equipment is basically essential. In addition, consumers and manufacturers alike have continued to desire smaller product size, which requires a continued decrease in overall IC chip size. As a result, the large-scale integration of circuit components, such as transistors and capacitors, has become a necessity for decreased overall size, but increased device performance. Thus, semiconductor device improvements have been largely accomplished by reducing device feature size to the point where currently micron and sub-micron device features are being used, and predictions for future device sizes do not foresee an end to the trend of ever smaller and denser devices.

Along with desired reductions in device size, and thus increased chip densities, comes a required reduction in device power consumption that imposes the use of decreased device feature lengths. This is because, as a general rule, device speed varies inversely with device feature length, while power consumption increases approximately with the square of the device feature length. Thus, feature sizes currently being employed are in the micron and sub-micron or 0.13 um range, and it is expected that the device and feature sizes will continue to decrease in the future.

Metal silicide has been employed to provide the electrical contact between parts of the semiconductor devices and metal interconnects primarily because of the reduced contact resistance and sheet resistance provided by metal silicide. Self-Aligned metal silicide contact structures, commonly referred to as "salicide" structures, are often used to minimize contact resistance. In a conventional salicide process, for example, for the contact pads for a MOS transistor, source and drain regions are formed aligned to a gate electrode structure and/or any sidewall spacers that may be present. A blanket metal layer is deposited so that silicon, at the upper surface of source, drain and gate regions, is in contact with the metal. Examples of suitable metal silicide gate materials include, but are not limited to tungsten silicides, titanium silicides, cobalt silicides, and nickel silicides, and combinations thereof. The wafer is then heated (annealed) to a temperature to undergo a reaction and form a metal silicide. Dielectrics, such as the sidewall spacers when the silicide process if for a transistor, prevent silicide formation in undesired locations. When no silicon is available on a part of a device structure, no silicide forms thereon. After the metal silicide is formed, the unreacted metal is then removed, and regions of metal silicide are revealed. After removal of the metal not reacted to form a silicide, a second, higher temperature silicide anneal step is often employed to stabilize the silicide regions formed and to provide the lowest possible silicide resistivity.

In view of the above, while salicide formed on gates and source/drain regions reduces parasitic resistance, line width limitations challenge salicide implementation in smaller features and devices. One type of salicide that has proven particularly effective in such applications has been cobalt salicide, i.e., cobalt silicide formed by a self-aligning process. Cobalt is regarded as a useful material in self-aligned salicide processing because of its low resistance and its silicon-compatible lattice structure. However, cobalt and cobalt salicide ($CoSi_x$), for example, in transistor applications, can penetrate into the junction area, resulting in junction leakage, increase in contact resistance, and deteriorating transistor current drive. Generally speaking, high temperatures are required for reacting cobalt and silicon, and a significant portion of the silicon substrate gets consumed in the process, causing the undesirable changes in the gate junction depth. Therefore, in conventional semiconductor manufacturing processes, cobalt salicide processing is typically only used in mid- and back-end processes to avoid process temperatures that are too high. In some applications, a titanium (Ti) or a titanium nitride (TiN) layer is formed on the cobalt layer prior to annealing in order to avoid cobalt oxidation.

However, the conventional process for depositing a Ti/TiN cap over the cobalt typically results in poor step coverage. More specifically, for example, looking at FIG. 1, which illustrates a semiconductor structure 100 having wordlines 110, 120 disposed on either side of a source/drain region 130, a convention deposition of a Ti/TiN cap 140 is shown deposited over a cobalt layer 150. With conventional processes, the cobalt 150 is deposited at generally equal thickness over both the wordlines 110, 120 as well as the source/drain region 130. However, in conventional processes, the Ti/TiN cap 140a deposition results in poor step coverage. More specifically, with such conventional processes is that the Ti/TiN cap layer 140 typically deposited on wordlines is too thick, usually as a consequence of trying to gain better step coverage over the source/drain region 130. Thus, as illustrated, although the Ti/TiN cap 140 thickness on the wordlines 110, 120 is high, the thickness of the Ti/TiN cap 140a over the source/drain region 130 is much lower in comparison. Consequently, the excess thickness of the Ti/TiN cap 140 over the wordlines 110, 120 tends to suppress cobalt silicide formation, and as a result the cobalt layer can exhibit thinning in certain areas on the wordline, which can result in an electrical open for that contact area even after the salicide process. Additionally, the insufficient thickness of the Ti/TiN cap 140a over the source/drain region 130 increases the possibility of agglomeration of the cobalt during the silicide process, which often results in leakage of the finished device.

Accordingly, in view of the above, it would be desirable to have new metal silicide formation processes for forming metal silicide contact pads on semiconductor device features, but that do not suffer from the deficiencies found in the conventional approaches.

SUMMARY

Disclosed herein are novel processes for forming metal silicide contact pads on semiconductor devices. For example, in some embodiments, disclosed are techniques for forming cobalt silicide contact pads on and between wordlines formed on a semiconductor device. Of course, other metal silicides may be formed on and between other types of raised silicon-based features using the disclosed techniques.

In one exemplary embodiment, a method for forming metal silicide contact pads on semiconductor devices may comprise depositing a metal layer on and between a plurality of raised silicon-based features formed on a semiconductor substrate, the metal layer comprising metal capable of reacting with external silicon-based portions of the features to form a metal silicide. In addition, such a method may also include depositing a cap layer on the metal layer deposited on and between the plurality of raised silicon-based features, wherein a thickness of the cap layer on the metal layer between the raised features is greater than or equal to a thickness of the cap layer on the metal layer on the raised features. Furthermore, such a method may also include annealing the structure to cause portions of the metal layer to react with portions of the external silicon-based portions of the features to form metal silicide pads on and between the raised features.

In another embodiment, a method of forming metal silicide contact pads on a semiconductor device may comprise depositing a first metal layer on and between a plurality of raised silicon-based features, wherein a thickness of the first metal layer on the raised features is greater than a thickness of the first metal layer between the raised features, and wherein the first metal layer comprises metal capable of reacting with external silicon-based portions of the features to form a metal silicide. Additionally, in this embodiment of the method, the method may further comprise depositing a second metal layer on the first metal layer deposited on and between the plurality of raised silicon-based features, wherein the first and second metal layers comprise substantially the same metal, and wherein a thickness of the second metal layer on the first metal layer between the raised features is greater than or equal to a thickness of the second metal layer on the first metal layer on the raised features. Next, the method may include depositing a cap layer on the second metal layer deposited on and between the plurality of raised silicon-based features. Then such an exemplary method may comprise annealing the structure to cause portions of the first and second metal layers to react with portions of the external silicon-based portions of the features to form metal silicide pads on and between the raised features.

In yet another embodiment, an exemplary method of forming cobalt silicide contact pads on a semiconductor device may comprise depositing a first cobalt layer on and between a plurality of raised silicon-based features, wherein a thickness of the first cobalt layer on the raised features is greater than a thickness of the first cobalt layer between the raised features. Such an exemplary method may then comprise depositing a second cobalt layer on the first cobalt layer deposited on and between the plurality of raised silicon-based features, wherein the first and second cobalt layers comprise substantially the same cobalt, and wherein a thickness of the second cobalt layer on the first cobalt layer between the raised features is greater than or equal to a thickness of the second cobalt layer on the first cobalt layer on the raised features. Such a method may then include depositing a titanium layer on the second cobalt layer deposited on and between the plurality of raised silicon-based features, and then depositing a titanium nitride layer on the titanium layer deposited on and between the plurality of raised silicon-based features. Then, such an exemplary method may comprise annealing the structure to cause portions of the first and second cobalt layers to react with portions of the external silicon-based portions of the features to form cobalt silicide pads on and between the raised features.

BRIEF DESCRIPTION OF THE DRAWINGS

For a more complete understanding of the principles disclosed herein, and the advantages thereof, embodiments are illustrated by way of example in the following figures in which like reference numbers indicate similar parts, and in which:

FIG. 1 illustrates a semiconductor device undergoing a conventional deposition process for metal silicide contact pad formation;

FIGS. 2A-2C illustrate one embodiment of a process for metal silicide contact pad formation performed in accordance with the principles disclosed herein; and FIG. 3A-3D illustrate another semiconductor embodiment of a process for metal silicide contact pad formation performed in accordance with the principles disclosed herein.

DETAILED DESCRIPTION

FIG. 2A illustrates a cross-sectional view of a semiconductor device 200 in the process of being fabricated in accordance with one embodiment of the disclosed principles. As shown in FIG. 2A, the semiconductor device 200 includes raised device features 210, 220, which in an exemplary embodiment are wordlines 210, 220 formed on a substrate. In such exemplary embodiments, the wordlines 210, 220 may be formed to a thickness of about 300~5 kÅ. Of course, the raised features 210, 220 may also be other device features on which a metal silicide, or a salicide, contact pad will be formed. Typically, the raised features 210, 220 comprise polysilicon, but they may also comprise other silicon-based materials that can be reacted with metals to form metal silicide on the exterior surface thereof.

Also illustrated in FIG. 2A, in accordance with the disclosed principles, a metal layer 250 is deposited directly on the wordlines 210, 220, as well as a metal layer 250a being deposited directly on a portion 230 of the substrate between the wordlines 210, 220 that also comprises a silicon-based material from which a metal silicide may be formed. In an exemplary embodiment, the portion 230 of the substrate between the wordlines 210, 220 is a source/drain region 230, however, the portion 230 between the wordlines 210, 220 may also comprise other silicon-based device features.

Moreover, the metal layer 250, 250a may comprise a metal selected from the group consisting of cobalt (Co), nickel (Ni), tungsten (W), molybdenum (Mo), zirconium (Zr), hafnium (Ha), tantalum (Ta), vanadium (V), neodymium (Nb), chromium (Cr), platinum (Pt) and palladium (Pd), or combinations thereof. In the discussion of the principles provided herein, the metal layer 250, 250a comprises cobalt based on the advantages provided by cobalt silicide contact pads discussed above. However, the discussion of a preferred embodiment of a metal layer 250, 250a comprising cobalt should not be construed as foregoing the use of other beneficial metals in a process conducted in accordance with the disclosed principles.

In exemplary embodiments employing cobalt as the metal, the metal layer 250, 250a is deposited to a thickness of about 120 angstroms. Moreover, exemplary process for depositing the metal layer 250, 250a may include a PVD process. In such an embodiment, the PVD process may be performed with Ar flowed at about 60-80 sccm, and a spacing from heater to target of about 2000-2800 mils, in order to obtain that exemplary thickness.

Next, according to this embodiment of the disclosed principles and also illustrated in FIG. 2B, a cap layer 240 is deposited directly on the metal layer 250 on the wordlines 210, 220, as well as a cap layer 240a deposited directly on the metal layer 250a deposited on the source/drain region 230 between the wordlines 210, 220. In an advantageous embodiment, the cap layer 240, 240a comprises titanium, however, other beneficial metals may also be employed. Importantly, in this embodiment, the portion of the cap layer 240a deposited on the metal layer 250a between the wordlines 210, 220 is deposited to a thickness that is greater than or equal to the thickness of the cap layer 240 deposited on the metal layer 250 formed directly above the wordlines 210, 220. As a result, the cap layer 240, 240a may be said to be deposited over topological features of the device 200 with "good step coverage," such that the material deposited between raised features on a semiconductor device is substantially greater or close to that deposited on the tops of such raised features.

In order to obtain the disclosed improved step coverage, the cap layer 240, 240a may be deposited using a PVD process. In such an embodiment, the PVD process may be performed at a temperature of about 15° C.-25° C. for about 0.3-10 minutes with DC power at about 400 W~3 kW, and perhaps with an $N_2$, He or Ar gas flowed during the deposition process, and spacing from heater to target of about 5200 mils. With such an exemplary process, the cap layer 240, 240a may be deposited to an exemplary thickness of about 300 angstroms. Furthermore, this embodiment of the disclosed principles may also include the deposition of a titanium nitride layer directly on the titanium layer, and thus comprising an upper portion of the cap layer 240, 240a. In such embodiments, the titanium nitride portion of the cap layer 240, 240a may be deposited using a PVD or MOCVD process. In one example, the titanium portion of the cap layer 240, 240a is deposited to about 150 angstroms, while the titanium nitride portion of the cap layer 240, 240a is deposited to about 150 angstroms.

Turning now to FIG. 2C, illustrated is the device 200 of FIGS. 2A and 2B after undergoing a salicide annealing process. Specifically, after the deposition of the metal layers 250, 250a and the cap layers 240, 240a as described above, the wafer on which the device 200 is being formed undergoes a thermal annealing process. In an exemplary embodiment, the annealing process includes heating the device 200 to a temperature of about 450-850° C., and for a time period of about 30-180 seconds, with a preferred range of about 500-700° C. for a time period of about 30 seconds. During such an exemplary annealing process, the metal layers 250, 250a react with the polysilicon (or other silicon-based material) forming the raised features 210, 220 (e.g., wordlines) and the diffused region 230 (e.g., source/drain region) to create a metal silicide. In a preferred embodiment, the metal is cobalt and this salicide process results in the formation of cobalt silicide pads 260 and 260a formed on the raised features 210, 220 and the diffusion region 230. To complete the salicide process, any residual metal layer 250, 250a and cap layer 240, 240a material may be removed.

Whether only a Ti cap layer 240, 240a or a Ti/TiN cap layer 240, 240a is formed, in this embodiment of the disclosed silicide formation technique, the cap layer 240, 240a is deposited with substantially equal step coverage over the source/drain regions 230. By providing better step coverage for the cap layer 240, 240a than is provided in conventional cap layer deposition processes, the additional thickness of the cap layer 240, 240a over the metal layer 250a on the source/drain region 230 better suppresses the cobalt silicide ($CoSi_x$) formation in the source/drain region 230. Stated another way, the conventional Ti or Ti/TiN deposition processes provide poor step coverage, and thus do not sufficiently suppress the metal silicide formation in the source/drain region 230. Consequently, metal agglomeration, and thus device leakage, typically occurs. However, with the increased suppression in the source/drain region 230 provided by this embodiment of the disclosed principles, less or no agglomeration of the metal (e.g., cobalt) molecules occurs in the source/drain region 230 following the salicide process, and without the need to increase the thickness of the metal deposited on the source/drain region 230. By decreasing agglomeration of the cobalt in the source/drain region 230 using the disclosed approach, less or no leakage of the finished device 200 results. Moreover, the metallization process according to the disclosed principles may be applied to any integrated circuit manufacturing process to improve the conditions for the interconnection or element characteristics, such that the overall efficiency of integrated circuit is improved.

Turning now to FIG. 3A, illustrated is a cross-sectional view of a semiconductor device 200 in the process of being fabricated in accordance with another embodiment of the disclosed principles. As shown in FIG. 3A, a semiconductor device 300 again includes raised device features 310, 320, which in an exemplary embodiment are wordlines 310, 320 formed on a substrate. As before, in exemplary embodiments, the wordlines 310, 320 may be formed to a thickness of about 300~5 kÅ. Also, the wordlines 310, 320 may again comprise polysilicon, but they may also comprise other silicon-based materials that can be reacted with metals to form metal silicide on the exterior surface thereof.

Also illustrated in FIG. 3A, a first metal layer is deposited on the raised features 310, 320 and on a portion 330 of the substrate between the wordlines 310, 320 that also comprises a silicon-based material from which a metal silicide may be formed, such as a source/drain diffusion region 330. Specifically, metal layer 350 is deposited directly on the wordlines 310, 320, while metal layer 350a is deposited directly on the source/drain region 330. Also as before, the first metal layer 350, 350a may comprise a metal selected from the group consisting of cobalt (Co), nickel (Ni), tungsten (W), molybdenum (Mo), zirconium (Zr), hafnium (Ha), tantalum (Ta), vanadium (V), neodymium (Nb), chromium (Cr), platinum (Pt) and palladium (Pd), or combinations thereof. However, the discussion of a preferred embodiment of a first metal layer 350, 350a comprising cobalt should not be construed as foregoing the use of other beneficial metals in a process conducted in accordance with the disclosed principles.

In accordance with this embodiment of the disclosed principles, the first metal layer 350, 350a is not deposited substantially evenly as was the case with embodiments discussed with reference to FIGS. 2A-2D. Instead, the first metal layer 350, 350a is deposited to a substantially greater thickness on the raised features 310, 320 than is deposited in the diffusion region 330 between the raised features 310, 320. In an advantageous embodiment of this aspect of the disclosed principles, the first metal layer 350 is again cobalt, and may be deposited using a PVD process. In such an embodiment, the PVD process may be performed at a temperature of about room temperature for about 0.5 minutes with DC power at about 400 W, and with Ar flowed at about 60-80 sccm, with spacing from heater to target of about 2000-2800 mils. With such an exemplary process, the first cobalt layer 350 on the raised features 310, 320 is deposited to a thickness of about 120 angstroms, while the poor step coverage of this process deposits the first cobalt layer 350a on the source/drain regions 330 to only about 30 angstroms. A distinct advantage of this technique for depositing a first metal layer 350, 350a intentionally with poor step coverage is the speed at which this first metal layer 350, 350a may be deposited. Since good step coverage is not trying to be obtained at this point in the disclosed process, the PVD process used to deposit the first metal layer 350, 350a may be performed significantly quicker than a metal deposition process targeting good step coverage.

In the next step of this embodiment of the disclosed salicide process, and as illustrated in FIG. 3B, a second metal layer 355, 355a is deposited directly one the first metal layer 350, 350a. As with the first metal layer 350, 350a, the second metal layer 355, 355a is deposited over the raised features 310, 320 and over the source/drain region 330. Moreover, the second metal layer 355, 355a may also comprise a metal selected from the group consisting of cobalt (Co), nickel (Ni), tungsten (W), molybdenum (Mo), zirconium (Zr), hafnium (Ha), tantalum (Ta), vanadium (V), neodymium (Nb), chromium (Cr), platinum (Pt) and palladium (Pd), or combinations thereof. However, in an advantageous embodiment, the second metal layer 355, 355a is comprised of the same or substantially the same metal(s) as the first metal layer 350, 350a. But the discussion herein of the first metal layer 350, 350a and second metal layer 355, 355a both comprising cobalt should not be construed as foregoing the use of other beneficial metals in a process conducted in accordance with the disclosed principles.

Now, further in accordance with this embodiment of the disclosed principles, the second metal layer 355, 355a is deposited substantially evenly over the raised features 310, 320 and over the diffusion region 330 between the raised features 310, 320. As a result, the portion of the second metal layer 355a over the source/drain region 330 is deposited to a thickness that is substantially equal to or greater than a thickness of the portion of the second metal layer 355 over the raised features 310, 320. In order to obtain this good step coverage for the second metal layer 355, 355a, in an advantageous embodiments of this aspect of the disclosed principles, the second metal layer 355, 355a may be deposited using a PVD process. In such an embodiment, the PVD process may be performed at a temperature of about room temperature for about 0.5-3 minutes with DC power at about 400 W, and Ar flowed at about 15-50 sccm, with spacing from heater to target of about 5200-6800 mils. With such an exemplary process, the second cobalt layer 355 on the raised features 310, 320 is deposited to a thickness of about 60 angstroms, while the good step coverage of this process deposits the second cobalt layer 355a on the source/drain regions 330 to also about 60 angstroms. Of course, other processes capable of providing such good step coverage for the second metal layer 355, 355a may also be employed.

Turning now to FIG. 3C, illustrated in the device of FIGS. 3A and 3B after a cap layer 340, 340a has been deposited. Specifically, in accordance with this embodiment of the disclosed principles, cap layer 340 is deposited directly on the second metal layer 355 over the wordlines 310, 320, while cap layer 340a deposited directly on the second metal layer 355a deposited over the source/drain region 330 between the wordlines 310, 320. As before, in an advantageous embodiment, the cap layer 340, 340a comprises titanium, however, other beneficial metals may also be employed. Alternatively, the cap layer 340, 340a may comprise a combination Ti/TiN cap layer 340, 340a as described above.

However, in this embodiment of the disclosed principles, the deposition process for the cap layer 340, 340a does not need to be a process focused on providing good step coverage for the area over the source/drain region 330. As a result, as was the case for the deposition process for the first metal layer 350, 350a, the deposition process for the cap layer 340, 340a may be performed quickly as compared to processes focused on providing good step coverage, thereby decreasing processing time for the cap layer 340, 340a deposition. For example, an exemplary process for depositing a combination Ti/TiN cap layer 340, 340a in this fashion would be to employ a PVD process. In such embodiments, the PVD process may be performed at a temperature of about room temperature for about 0.5-3 minutes, and perhaps with an $N_2$, He or Ar gas flowed during the deposition process. For example, for Ti deposition, Ar may be flowed at about 50-100 sccm, with spacing from heater to target of about 4000 mils and DC power at about 1000 W. For TiN cap deposition, Ar may be flowed at about 25-50 sccm, $N_2$ flowed at about 50-75 sccm, and DC power at about 6500 W. With such an exemplary process, the portion of the cap layer 340 over the wordlines 310, 320 may be deposited to an exemplary thickness of about 350 angstroms, while the portion of the cap layer 340a over the source/drain region 330 may be deposited to an exemplary thickness of about 150 angstroms.

Turning now to FIG. 3D, illustrated is the device 300 of FIGS. 3A-3C after undergoing a salicide annealing process. Specifically, after the deposition of the first and second metal layers 350, 350a, 355, 355a and the cap layers 340, 340a as described above, the wafer on which the device 300 is being formed undergoes a thermal annealing process. In an exemplary embodiment, the annealing process includes heating the device 300 to a temperature of about 450-850° C., and for a time period of about 30-180 seconds, with a preferred range of about 500-700° C. for a time period of about 30 seconds. During such an exemplary annealing process, both the first and second metal layers 350, 350a, 355, 355a react with the polysilicon (or other silicon-based material) forming the raised features 310, 320 (e.g., wordlines) and the diffused region 330 (e.g., source/drain region) to create a metal silicide. In a preferred embodiment, the metal for the first and second metal layers 350, 350a, 355, 355a is cobalt and this salicide process results in the formation of cobalt silicide pads 360 and 360a formed on the raised features 310, 320 and the diffusion region 330. To complete the salicide process, any residual material from the first and second metal layers 350, 350a, 355, 355a and the cap layer 240, 240a may be removed.

With this alternative embodiment of the disclosed principles for creating metal silicide contact pads, the agglomeration of metal (e.g., cobalt) molecules in the source/drain region 330 during the silicide process is again reduced or eliminated. In this particular embodiment, the agglomeration is prevented by the use of two metals with different step coverage, which can prevent the WL silicide from becoming too thick (i.e., due to worse step coverage), or the silicide in the bottom from being too thin. Using a two-step metal deposition can improve the step coverage, and prevent too much thickness in the top of WL or too thin on the bottom of the WL. The feasible thickness of silicide on the source/drain will not induce leakage, however. Furthermore, it can prevent the metal silicide segregation forming an open connection issue (i.e., if the metal is too thin on the bottom). The agglomeration happens on the word line bottom because it is too thin. After annealing, there will be segregation and thus agglomeration. The only way is to increase the thickness of the Co, however, typically induces word line surface leakage (i.e., too thick). Therefore, the two metal deposition process can resolve the issues caused by the bottom being too thin and the word line being too thick. As a result, as before, with decreased agglomeration, device leakage is reduced or eliminated. Moreover, the silicide formation process according to the disclosed principles may be applied to any integrated circuit manufacturing process to improve the conditions for the interconnection or element characteristics, such that the overall efficiency of integrated circuit is improved.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of forming metal silicide contact pads on a semiconductor device, the method comprising:
    depositing a metal layer on and between a plurality of raised silicon-based features formed on a semiconductor substrate, the metal layer comprising metal capable of reacting with external silicon-based portions of the features to form a metal silicide;
    depositing a cap layer on the metal layer deposited on and between the plurality of raised silicon-based features, wherein a thickness of the cap layer on the metal layer between the raised features is greater than a thickness of the cap layer on the metal layer on the raised features; and
    annealing the structure to cause portions of the metal layer to react with portions of the external silicon-based portions of the features to form metal silicide pads on and between the raised features.

2. A method according to claim 1, wherein the metal layer comprises metal selected from the group consisting of cobalt (Co), nickel (Ni), tungsten (W), molybdenum (Mo), zirconium (Zr), hafnium (Ha), tantalum (Ta), vanadium (V), neodymium (Nb), chromium (Cr), platinum (Pt) and palladium (Pd).

3. A method according to claim 1, wherein depositing the cap layer comprises depositing a titanium layer on the metal layer deposited on and between the plurality of raised silicon-based features.

4. A method according to claim 3, wherein depositing the cap layer further comprises depositing a titanium-nitride layer on the titanium layer.

5. A method according to claim 1, wherein the raised silicon-based features, and portions of the substrate between the raised features, comprise polysilicon.

6. A method according to claim 5, wherein the silicon-based features are wordlines, and the portions of the substrate between the wordlines are source/drain regions.

7. A method according to claim 1, further comprising depositing a second metal layer on the metal layer deposited on and between the plurality of raised silicon-based features, wherein a thickness of the second metal layer on the metal layer between the raised features is greater than or equal to a thickness of the second metal layer on the metal layer on the raised features.

8. A method according to claim 7, wherein the second metal layer is deposited directly on the metal layer.

9. A method according to claim 7, wherein the thickness of the second metal layer on the metal layer between the raised features is greater than the thickness of the second metal layer on the metal layer on the raised features.

10. A method of forming metal silicide contact pads on a semiconductor device, the method comprising:
    depositing a first metal layer on and between a plurality of raised silicon-based features, wherein a thickness of the first metal layer on the raised features is greater than a thickness of the first metal layer between the raised features, and wherein the first metal layer comprises metal capable of reacting with external silicon-based portions of the features to form a metal silicide;
    depositing a second metal layer on the first metal layer deposited on and between the plurality of raised silicon-based features, wherein the first and second metal layers comprise substantially the same metal, and wherein a thickness of the second metal layer on the first metal layer between the raised features is greater than or equal to a thickness of the second metal layer on the first metal layer on the raised features;
    depositing a cap layer on the second metal layer deposited on and between the plurality of raised silicon-based features; and
    annealing the structure to cause portions of the first and second metal layers to react with portions of the external silicon-based portions of the features to form metal silicide pads on and between the raised features.

11. A method according to claim 10, wherein the first and second metal layers comprise metal selected from the group consisting of cobalt (Co), nickel (Ni), tungsten (W), molybdenum (Mo), zirconium (Zr), hafnium (Ha), tantalum (Ta), vanadium (V), neodymium (Nb), chromium (Cr), platinum (Pt) and palladium (Pd).

12. A method according to claim 10, wherein depositing the cap layer comprises depositing a titanium layer on the second metal layer deposited on and between the plurality of raised silicon-based features.

13. A method according to claim 12, wherein depositing the cap layer further comprises depositing a titanium-nitride layer on the titanium layer.

14. A method according to claim 10, wherein the raised silicon-based features, and portions of the substrate between the raised features, comprise polysilicon.

15. A method according to claim 14, wherein the silicon-based features are wordlines, and the portions of the substrate between the wordlines are source/drain regions.

16. A method according to claim 10, wherein the second metal layer is deposited directly on the first metal layer.

17. A method according to claim 10, wherein the thickness of the second metal layer on the first metal layer between the raised features is greater than the thickness of the second metal layer on the first metal layer on the raised features.

18. A method of forming metal silicide contact pads on a semiconductor device, the method comprising:
    depositing a first cobalt layer on and between a plurality of raised silicon-based features, wherein a thickness of the first cobalt layer on the raised features is greater than a thickness of the first cobalt layer between the raised features;
    depositing a second cobalt layer on the first cobalt layer deposited on and between the plurality of raised silicon-based features, wherein the first and second cobalt layers comprise substantially the same cobalt, and wherein a thickness of the second cobalt layer on the first cobalt layer between the raised features is greater than or equal to a thickness of the second cobalt layer on the first cobalt layer on the raised features;

depositing a titanium layer on the second cobalt layer deposited on and between the plurality of raised silicon-based features;

depositing a titanium nitride layer on the titanium layer deposited on and between the plurality of raised silicon-based features; and annealing the structure to cause portions of the first and second cobalt layers to react with portions of the external silicon-based portions of the features to form cobalt silicide pads on and between the raised features.

19. A method according to claim 18, wherein the silicon-based features are wordlines, and the portions of the substrate between the wordlines are source/drain regions.

20. A method according to claim 18, wherein the second cobalt layer is deposited directly on the first cobalt layer.

21. A method according to claim 18, wherein the thickness of the second cobalt layer on the first cobalt layer between the raised features is greater than the thickness of the second cobalt layer on the first cobalt layer on the raised features.

* * * * *